US007123034B2

(12) United States Patent
Sausen

(10) Patent No.: US 7,123,034 B2
(45) Date of Patent: Oct. 17, 2006

(54) CONTACTOR ASSEMBLY FOR COMMON GRID ARRAY DEVICES

(76) Inventor: Earl William Sausen, 1370 Redwood La., Gilroy, CA (US) 95020

( * ) Notice: Subject to any disclaimer, the term of this patent is extended or adjusted under 35 U.S.C. 154(b) by 175 days.

(21) Appl. No.: 10/288,274

(22) Filed: Nov. 5, 2002

(65) Prior Publication Data

US 2003/0128040 A1 Jul. 10, 2003

Related U.S. Application Data

(63) Continuation-in-part of application No. 09/929,768, filed on Aug. 14, 2001, now Pat. No. 6,489,788.

(51) Int. Cl.
*G01R 31/02* (2006.01)

(52) U.S. Cl. ........................ 324/754; 324/761
(58) Field of Classification Search ................ 324/754, 324/755, 761, 763
See application file for complete search history.

(56) References Cited

U.S. PATENT DOCUMENTS

| | | | | |
|---|---|---|---|---|
| 5,570,033 A | * | 10/1996 | Staab | 324/754 |
| 5,705,932 A | * | 1/1998 | Fredrickson | 324/754 |
| 5,748,007 A | * | 5/1998 | Gaschke | 324/754 |
| 5,955,888 A | * | 9/1999 | Frederickson et al. | 324/754 |
| 6,069,482 A | * | 5/2000 | Hilton | 324/755 |
| 6,181,149 B1 | * | 1/2001 | Godfrey et al. | 324/754 |
| 6,292,003 B1 | * | 9/2001 | Fredrickson et al. | 324/754 |
| 6,489,788 B1 | * | 12/2002 | Sausen | 324/754 |

* cited by examiner

*Primary Examiner*—David A. Zarneke
*Assistant Examiner*—Jermele M. Hollington
(74) *Attorney, Agent, or Firm*—Patrick Reilly

(57) ABSTRACT

A contactor apparatus used in automatic testing of integrated circuits is provided. The invented apparatus, or assembly, enables the rapid automated test transition from testing a plurality of devices of a first body shape to a plurality of devices having a second body shape, where both types of devices have electrical contacts arranged within a device contact plane and according to a common grid pattern. The common grid pattern may be arranged along an X and an orthogonal Y axis, where contact points are spaced at identical intervals along each axis, e.g. a contact point at each 0.8 millimeter by 0.8 millimeter location, or where the contact points are spaced at differing intervals in each dimension, e.g. a plurality of contact points located at 0.8 millimeter lengths along the X axis and at 1.2 millimeter lengths along the Y axis. The contactor may have a plurality of apertures useful to simultaneously test a plurality of devices.

4 Claims, 10 Drawing Sheets

CONTACTOR ASSEMBLY FOR COMMON GRID ARRAY DEVICES

CONTINUATION-IN-PART

This application is a Continuation-in-Part to application Ser. No. 09/929,768, now U.S. Pat. No. 6,489,788 filed on Aug. 14, 2001 and issued on Dec. 3, 2002.

FIELD OF THE INVENTION

The present invention relates to an apparatus for providing electrical signal pathways during test between an electronic device, such as an electronic module or an integrated electrical semiconductor circuit, and an automated test system. The invented assembly more particularly relates to interfacing systems that position an electrical device, the device having electrical contacts arranged within a substantially planar pattern and in a two-dimensional spacing pattern that is common to a plurality of electronic device products.

BACKGROUND OF THE INVENTION

The costs of testing integrated circuit die and packaged electrical devices are significant components of the manufacturing costs of semiconductor devices. The prior art attempts to limit the costs of testing but requires the use of electrical contactors that are overly specific to particular device types. There is therefore a long felt need to provide a test contactor that may be more easily reconfigurable and/or to be useful in testing a wider variety of part numbers than the prior art allows.

SUMMARY OF THE INVENTION

It is an object of the present invention to provide an apparatus, or assembly, useful in testing an electronic device or semiconductor device by an automated test system.

An invented contactor apparatus, or contactor assembly, useful in testing a device under test with an automated test system is provided. The contactor assembly, or assembly, includes a signal distribution board, a pogo body having a plurality of pins, and a device nest. The assembly, or electrical interconnect, provides signal pathways between a set of device electrical contacts of a device under test and the pin electronics of the automated test system. Certain alternate preferred embodiments of the present invention comprise a plurality of pogo bodies, whereby a plurality of devices may be simultaneously tested.

The device under test, or device, seats within the nest and makes electrical contact with the test system via the pins and the signal distribution board. The device may be a packaged or a partially packaged electronic device, such as a discrete device, a transistor or a plurality of transistors, an electronic memory, a logic device, a linear or analog device, a mixed signal device, a multi-chip module or an integrated semiconductor circuits.

The signal distribution board has a tester side, an upper side and a plurality of signal distribution traces. The traces are composed of an electrically conductive material or composite, such as copper or a copper alloy, or other suitable electrically conductive materials known in the art, in singularly or in combination. Each trace includes a tester side contact, an upper side contact and a signal distribution pathway. Each trace provides an electrical signal pathway from its tester side contact to its upper side contact via its signal distribution pathway. Each trace electrical signal pathway may include one or more passive or active electrical devices and may be bi-directional or unidirectional. The tester side contacts are located along the tester side of the signal distribution board and in a pattern that partially or completely matches a pin electronics pattern of the tester, whereby some or all of the pin electronics contacts of the tester can simultaneously make separate electrical contacts with individual tester side contacts of certain or all of the traces of the signal distribution board. The upper side contacts of the traces are located along the upper side of the signal distribution board and in a two-dimensional grid pattern. The two-dimensional grid pattern may be a partially or totally arranged according to a personality pattern, the personality pattern including a contact pattern or patterns that match a pattern or patterns of device electrical contacts of a variety of electronic device products. The device electrical contact pattern may partially or wholly match a common grid array pattern, where the personality pattern, or grid pattern, comprises the common grid pattern and the personality pattern additionally matches or repeatedly matches the device contact patterns of a plurality of functionally differing or differently shaped packaged or partially packaged devices.

In certain preferred embodiments of the present invention the personality pattern may provide or include a pattern for locating a plurality of electrical contacts in an orthogonal, two-dimensional X axis and Y axis pattern with substantially equivalent X and Y separations of 0.5 millimeter, 0.6 millimeter, 0.8 millimeter, 0.75 millimeter, 1.0 millimeter, 1.2 millimeter, or another suitable device electrical contact arrangement or location pattern known in the art.

In certain still alternate preferred embodiments the personality pattern may alternatively or additionally include a pattern for locating a plurality of device electrical contacts in an orthogonal, two-dimensional X axis and Y axis pattern wherein the separations between certain or all of the electrical device contacts are in a first spacing along the X axis, such as 0.8 millimeter, and a second spacing along the Y axis, such as 1.2 millimeter. The resulting pattern may thereby provide device electrical contacts located in a grid at every or at certain X and Y locations in a 0.8 millimeter X axis by 1.2 millimeter Y axis array, or in another suitable spacing pattern or planar array known in the art.

The pogo body houses a plurality pins, each pin having a board contact, a body and a device contact. The pins are electrical conductive and may comprise suitable electrically conductive materials or composites known in the art, such as gold, nickel, copper or metal alloys, in singularity or in combination.

The pogo body, or vertical signal frame 6, of the preferred embodiment is detachably attached to the signal distribution board by latches, screws, attachments, guide pin and receiver bushing features, ramp and pin mechanisms, or other suitable detachable attachment systems known in the art. The plurality of pins, or plurality of elongate vertical pins, of the preferred embodiment each have a board contact, an elongate body and a device contact. The vertical signal frame 6 maintains the plurality of elongate vertical pins in a substantially perpendicular orientation to the upper side of the signal distribution board. The elongate vertical pins are arranged in a pattern within or by the vertical signal frame 6 that matches a device electrical contact pattern of the device under test. The personality pattern of the preferred embodiment repeatedly matches the device electrical contact pattern whereby a plurality of devices having similar or identical device electrical contact patterns may be substantially simultaneously in electrical contact with the automated test system.

The device nest device is a mechanical component that is designed to guide the device under test into an orientation with the pogo body that enables the substantially simultaneous electrical connection of a plurality of electrical contacts of the device under test with the plurality of pins of the pogo body. In the preferred embodiment, the device nest is detachably attached to the vertical signal frame and guides the plurality of electrical contacts of the device under test into electrical contact with the device contacts of the elongate vertical pins. The device nest is designed in accordance with the physical form and dimensions of the device under test and the orientation of the package or partial package of the device under test with the device electrical contact pattern of the device under test. The device nest has a frame with an aperture. The aperture is shaped within the frame to conform to the shape of the package or partial package of the device and to guide the device into electrical contact with the plurality of elongate vertical pins. The aperture is further shaped to stabilize the device within the device nest while the automated tester tests the device.

In the preferred embodiment the device under test may be a ball grid array device that has a device electrical contact pattern arranged in a substantially two-dimensional planar pattern, where individual contacts are located at regular X axis and Y axis displacements of 0.5 millimeter, 0.6 millimeter, 0.8 millimeter, 0.75 millimeter, 1.0 millimeter, 1.2 millimeter, or any suitable device electrical contact arrangement or location pattern known in the art. It is not necessary that the device under test have an electrical contact at each possible X, Y location within the device electrical contact pattern or the personality pattern.

The device nest of the preferred embodiment is designed to seat the device under test into an orientation that enables electrical connectivity between the plurality of electrical contacts of the device under test and the plurality of device contacts of the elongate vertical pins, whereby the device under test or a plurality of devices may be electrically tested by the automated test system and via the invented assembly or a plurality of invented assemblies.

The foregoing and other objects, features and advantages will be apparent from the following description of the preferred embodiment of the invention as illustrated in the accompanying drawings.

BRIEF DESCRIPTION OF THE DRAWINGS

These, and further features of the invention, may be better understood with reference to the accompanying specification and drawings depicting the preferred embodiment, in which.

DETAILED DESCRIPTION OF THE PREFERRED EMBODIMENT

In describing the preferred embodiments, certain terminology is utilized for the sake of clarity. Such terminology is intended to encompass the recited embodiment, as well as all technical equivalents which operate in a similar manner for a similar purpose to achieve a similar result. Reference is made in the following detailed description of the preferred embodiment to the drawings accompanying this disclosure. These drawings illustrate specific embodiments in which the invention may be practiced. It is to be understood that other embodiments may be utilized and structural changes may be made by one skilled in the art and in light of this disclosure and without departing from the scope of the claims of the present invention.

Figure 1:
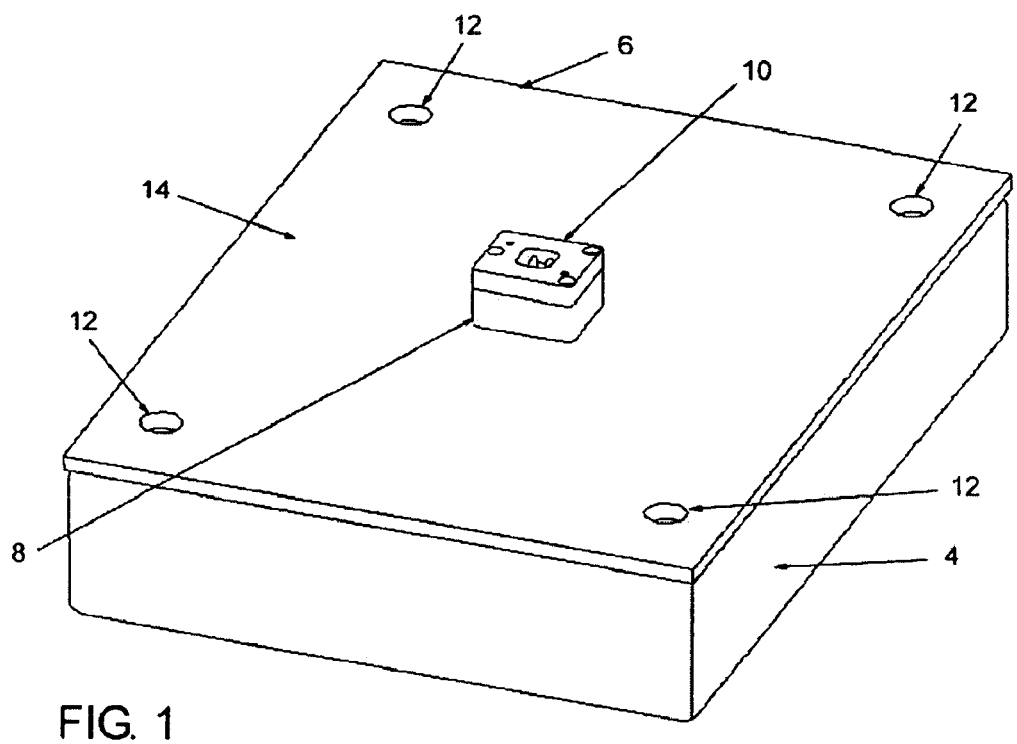
FIG. 1 is an isometric drawing of a preferred embodiment of the present invention in situ with an automated test system.

Referring now generally to the Figures and particularly to FIG. 1, a preferred embodiment of the present invention 2, or electrical interconnect 2, is detachably attached to a test head 4 of an automated electrical device test system. The interconnect 2 comprises an electrical signal distribution board 6, a pogo body 8 and a device nest 10. Electrical distribution board 6, or contactor board 6 is detachably attached to the test head 4 by tester attachments 12. Tester attachments 12 may comprise a screw, a thru hole in the contactor board 6 and a tapped receiver in the test head 4, or another suitable detachable attachment mechanism or system known in the art.

A handler guide fixture 14 of the contactor board is useful to orient a test handler or wafer prober to the interconnect 2 for docking the test head 4 to the handler or prober. The handler guide fixture 14 may be a guide pin, a guide pin receiver, a guide pin bushing, or another suitable mechanical guide or registration system known in the art.

Figure 1A:
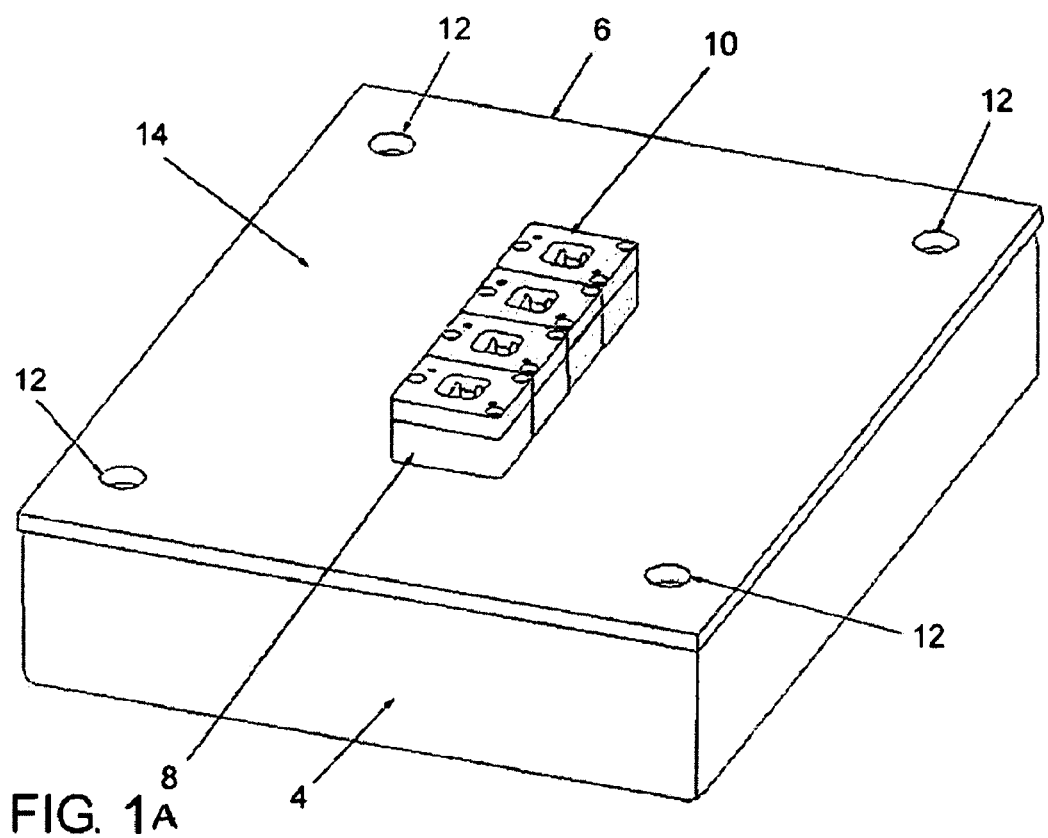
FIG. 1A is an isometric drawing of the electrical interconnect of FIG. 1 modified to comprise and employ pluralities of pogo bodies and device nests.

Referring now generally to the Figures and particularly to FIG. 1 and FIG. 1A, FIG. 1A is an isometric drawing of the electrical interconnect 2 of FIG. 1 modified to comprise and employ pluralities of pogo bodies 8 and device nests 10.

Figure 2A:
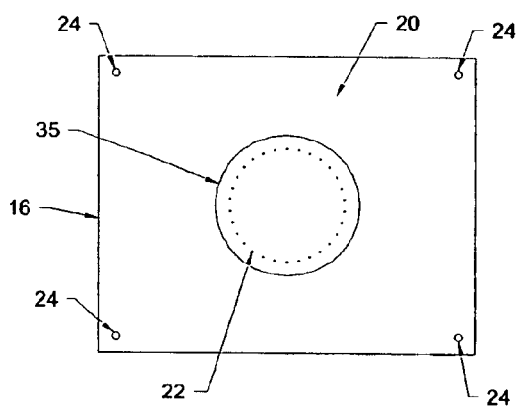
FIGS. 2A and 2B are a tester side and an upper side of a contactor board of the preferred embodiment of FIG. 1.
Figure 2B:
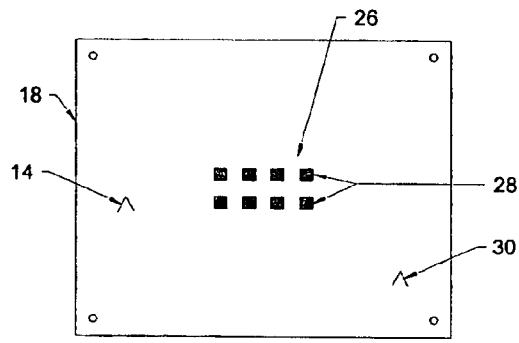

Referring now generally to the Figures and particularly to FIGS. 2A and 2B, the contactor board 6 has a tester side 16 and an upper side 18. The tester side 16 of the contactor board 6 has a pattern 20 of tester side contacts 22 that match a pin electronics pattern of the test head 4, whereby the tester side 16 makes simultaneous electrical contact with a plurality of pin electronics contacts of the test head 4 at the tester side contacts 22 when the interconnect 2 is detachably attached to the test head 4. The tester side 16 additionally has a tester attachment and release mechanism 24 that enables the contactor board 6 to be detachably attached and subsequently detached or released from the test head 4. The upper side 18 of the contactor board 6 has a pattern 26 of upper side contacts 28 that match a contact pattern 29 of one or more electrical device types. The upper side 18 of the contactor board 6 optionally has the handler guide fixture 14 that may be a guide pin, or a guide pin bushing, or another suitable mechanical registration or docking element known in the art. The upper side 18 additionally has an optional set of guide fixtures 30 useful for aligning the pogo body 8, or vertical signal frame 8, or the device nest 10 with the contactor board 6. The contactor board 6 further comprises a stiffener frame 35 that increases the planarity of the contactor board 6. the stiffener frame 35 may be made of a sufficiently rigid metal or other sufficiently rigid material, element or composite known in the art.

Figure 3:
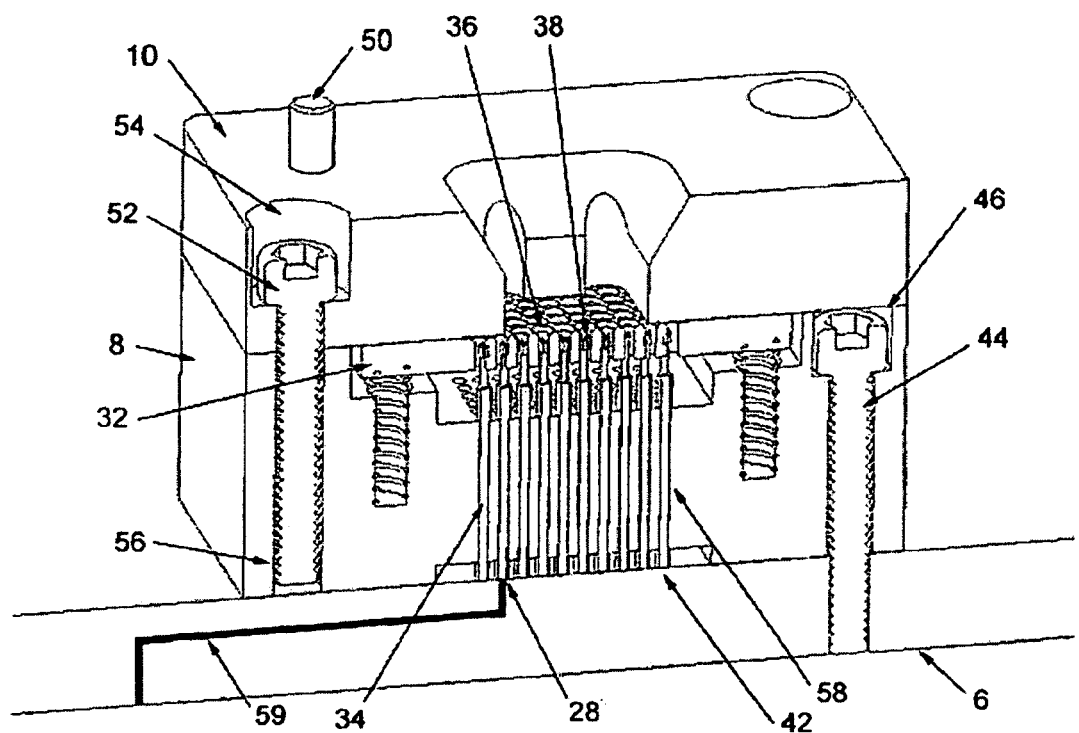
FIG. 3 is a cross sectional view of a device nest and a vertical signal frame of the preferred embodiment of FIG. 1. preferred embodiment of the present invention of FIG. 1 and attached to the automated test system of FIG. 1.
Figure 4:
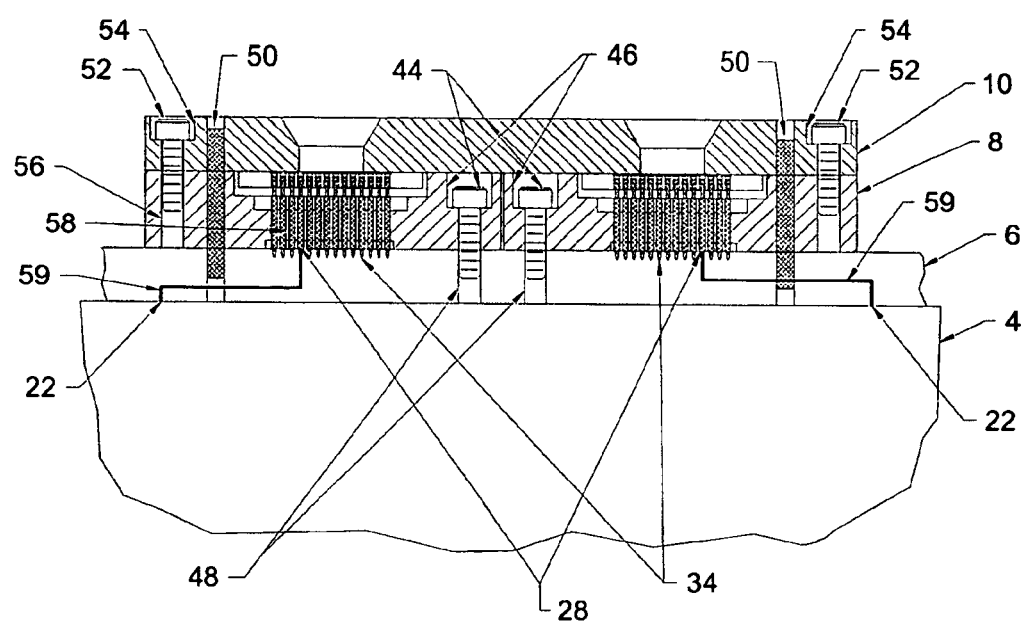
FIG. 4 is a cross-sectional view of the preferred embodiment of FIG. 1 attached to a test head of FIG. 1.

Referring now generally to the Figures and particularly to FIGS. 3 and 4, cross sectional views of the device nest 10 and the vertical signal frame 8 of the interconnect shows the floating plate 32 and the elongate vertical pins 34 of the vertical signal frame 8. The floating plate 32 has a plurality of apertures 36 that allow the elongate pins 34 to extend through the vertical signal frame 8 and the floating plate 32 when the floating plate 32 is pressed against the vertical signal frame 8. The floating plate 32 provides protects the interconnect 2 from debris and contamination and also provides a stability to a device as the device falls into or is pressed through the device nest 10 and towards the vertical signal frame 8.

The elongate pins 34 are electrically conductive and are made with copper, gold, or another suitable electrically conductive material, element or composite known in the art. Each elongate pin 34 has a device contact 38, an elongate body 40, and a tester contact 42. Each elongate pin 34 may be spring loaded or spring biased whereby the device contact and/or the tester contact press against an object when the elongate body 34 is compressed against or by the body, where the may be, for example, the test head 4 or an electrical device.

The cross-sectional views of the interconnect 2 of FIGS. 3 and 4 show the optional guide fixtures 30, 50 of the upper side 18 aligning the vertical signal frame 8 or the device nest 10 with the contactor board 6. A detachable attachment screw 44 passes through a vertical signal frame receiver 46 of the vertical signal frame 8 and screws into a tapped receiver 48 of the contactor board 6. The vertical signal frame 8 is thereby detachably attached to the contactor board 6 by the detachable attachment screw 44.

The cross-sectional views of the interconnect 2 of FIGS. 3 and 4 additionally show an optional nest guide fixture 50 of the vertical signal frame 8 aligning the device nest 10 with the vertical signal frame 8. A detachable attachment screw 52 passes through a device nest receiver 54 of the device nest 10 and screws into a tapped frame receiver 56 of the vertical signal frame 8. The device nest 10 is thereby detachably attached to the vertical signal frame 8 by the detachable attachment screw 44.

Referring now generally to the Figures and particularly to FIG. 3, a plurality of pin receivers 58 of the vertical signal frame 8 orient the elongate pins 34 and substantially enable the electrical connection of the elongate pins 34 with the contactor board 6 and an electrical device under test.

Referring now generally to the Figures and particularly to FIGS. 3 and 4, a cross-sectional view of the interconnect 2 as attached to the test head 4 shows the optional guide fixtures 30 & 14 and the nest guide fixture 50 aligning the device nest 6 and the vertical signal frame and the contactor board 6 with the test head 4. A plurality of signal distribution traces 59 of the contactor board 6 each individually provide an electrical signal pathway from an individual upper side contact 28 to an individual tester side contact 22. Certain alternate preferred embodiments of the present invention include signal distribution traces 59 that provide a signal pathway from an individual tester side contact 22 to a plurality of upper side contacts 28, and/or include signal distribution traces 58 that provide a signal pathway from an individual upper side contact 28 to a plurality of tester side contacts 22, and/or include signal distribution traces 58 that provide a signal pathway from two or more upper side contacts 28 to two or more tester side 22 contacts.

Figure 5A:
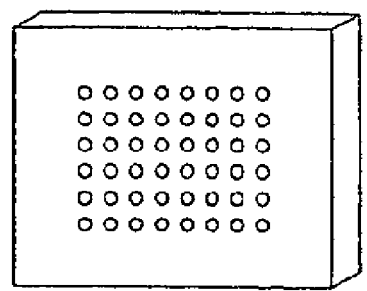
FIG. 5A is a contact side of a device having a plurality of ball grid contacts.

Referring now generally to the Figures and particularly to FIG. 5A, a contact side 60 of an electrical device 62 has a plurality of ball grid contacts 64. The side view of FIG. 5B of the electrical device 62, or device 62, shows two dimensions of a body 64 of the device 62. The device 62 has 48 ball grid contacts 64 arranged in an X-Y orthogonal pattern 66 of contact locations 68 spaced at each 0.80 by 0.80 millimeter X, Y intersection. An alternate vertical signal frame 70 of FIG. 5C has a pattern of pin receivers 58 that match the pattern 66 of contact locations 68 of the device 62, whereby the alternate vertical signal frame 70 may be positioned to enable a plurality of vertical pins 34 to simultaneously make electrical contact with the device 62.

Figure 5C:
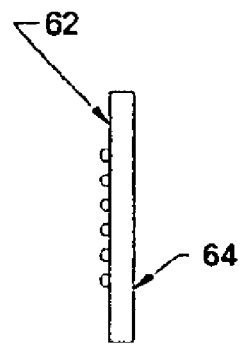
FIG. 5C is the contact pattern of the device of FIG. 5A.
Figure 6A:
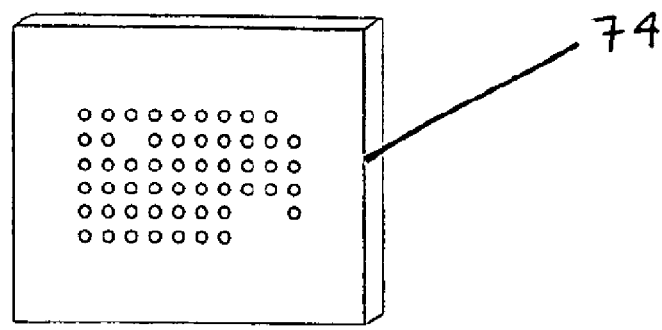
FIG. 6A is a contact side of an alternate device having a plurality of ball grid contacts.
Figure 6B:
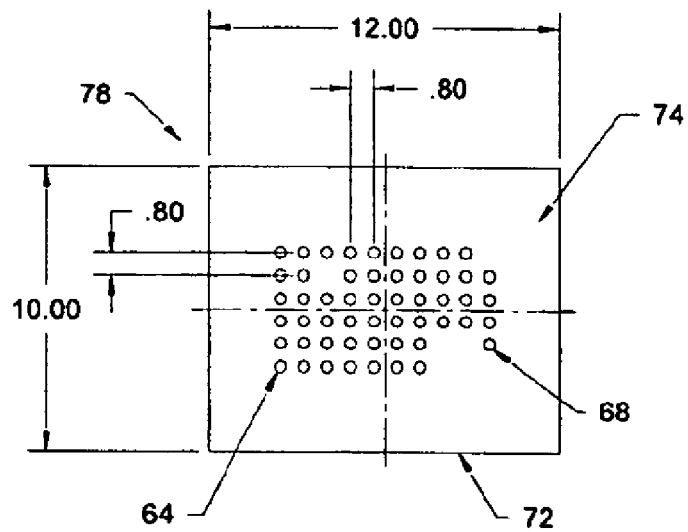
FIG. 6B is a side view of the alternate device of FIG. 6A.
Figure 6C:
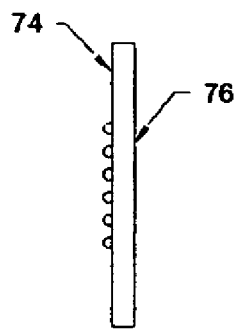
FIG. 6C is the contact pattern of the alternate device of FIG. 6A.

Referring now generally to the Figures and particularly to FIG. 6A, an alternate contact side 72 of an alternate electrical device 74 has a plurality of ball grid contacts 64. The side view of FIG. 6B of the alternate electrical device 74, or device 74, shows two dimensions of a body 76 of the alternate device 74. The alternate device 74 has 41 ball grid contacts 64 arranged in an alternate X-Y orthogonal pattern 78 of contact locations 68 spaced according to and within a larger pattern of 0.80 by 0.80 millimeter X, Y intersections. An alternate vertical signal frame 80 of FIG. 5C has a pattern of pin receivers 58 that match the alternate pattern 78 of contact locations 68 of the alternate device 74, whereby the alternate vertical signal frame 80 may be positioned to enable a plurality of vertical pins 34 to simultaneously make electrical contact with the alternate device 74. Of particular note, the vertical signal frame 70 may be used to make contact with the ball grid contacts 64 of FIG. 6A as the pattern of pin receivers 58 of the vertical signal frame 70 is a superset of the alternate pattern 78 of contact locations 68 of the alternate device 74. The vertical signal frame 70 may thus be used to test either the device 62 of FIG. 5A or the alternate device 74 of FIG. 6A. In some cases, appropriate pin receivers 58 of the vertical signal frame 70 are preferably presented to the alternate device 74 without vertical pins, either to save the cost of unnecessary elongate pins 34, or to avoid unnecessary compressing of the devices against the unnecessary pins.

Figure 5B:
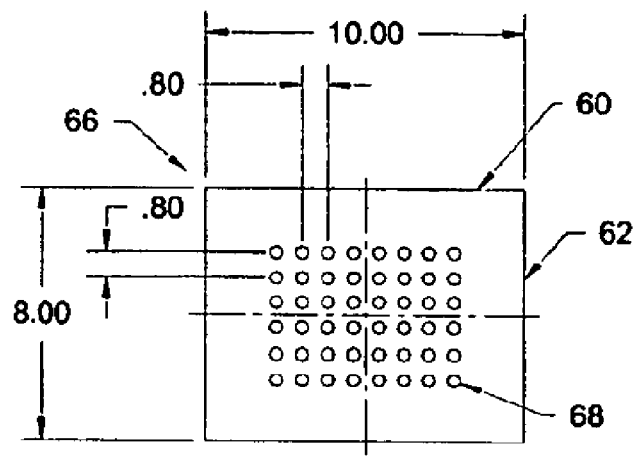
FIG. 5B is a side view of the device of FIG. 5A.
Figure 7:
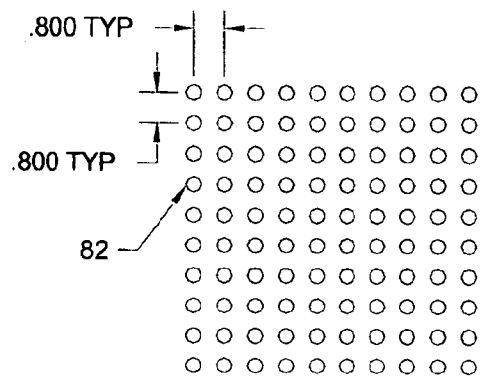
FIG. 7 is a schematic diagram of a personality pattern that matches both of the device electrical contact patterns of the devices of FIGS. 5A and 5B.

Referring now generally to the Figures and particularly to FIG. 7, FIG. 7 is a schematic diagram of a personality pattern 82 that simultaneously matches the device electrical contact patterns 66 & 78 of the devices of FIGS. 5A and 5B. The personality pattern may be sized to fit the contact patterns 66 & 78 of families of device types, or package styles, or of industry standard contact patterns. The provision of vertical signal frames 8, 70 & 80 that have a pattern of pin receivers 58 that match a personality pattern 82 common to industry standard manufacturing practices enables certain preferred embodiments of the present invention to be used with large pluralities of electrical device product types, makes and models. An individual vertical signal frame 8, 70 & 80 may thereby have an increased economic value over the prior art by a ubiquitous utility in testing pluralities of device types with the vertical signal frame 8, 70 & 80.

Figure 8A:
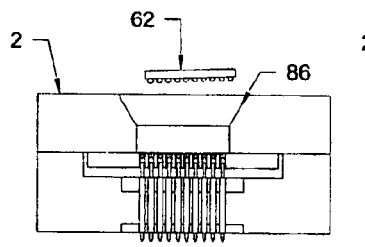
FIGS. 8A through 8F is a cutaway perspective view of the device of FIG. 5A entering the preferred embodiment of FIG. 1 and moving into a test position of FIG. 8F.
Figure 8B:
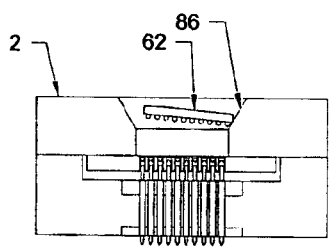
Figure 8C:
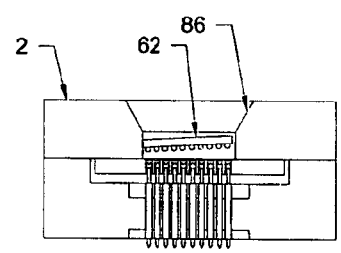
Figure 8D:
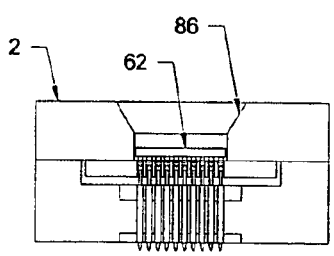
Figure 8E:
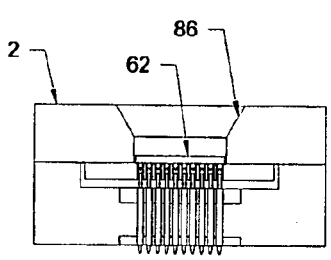
Figure 8F:
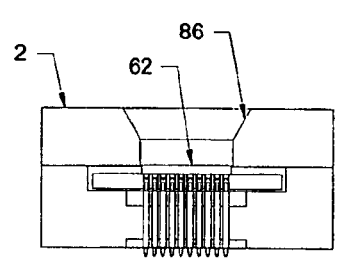

Referring now generally to the Figures and particularly to FIGS. 8A through 8F is a cutaway perspective view shows the device 62 of FIG. 5A entering the interconnect 2 and moving into a test position 84 as shown in FIG. 8F. The device nest 10 is sized to accept the device 62 into a nest aperture 86 of the device nest 10. The device nest 10 is further sized and shaped to encourage the non-destructive settling or advancement of the device 62 towards the floating plate 32 and the elongate pins 34. FIGS. 8A through 8F show a progressive travel of the device 62 from outside of the device nest 10, as per FIG. 8A, and to a test position 84 where the device is compressing the elongate pins 34 and making electrical contact with the interconnect 2. The device nest 10 may be sized to fit the bodies 64 & 76 of families of device types, or package styles, or of industry standard contact patterns. The provision of device nests 10 that enable and encourage the non-destructive insertion into the interconnect 2 of a body style or a plurality of styles common to industry standard manufacturing practices enables certain preferred embodiments of the present invention to be used with large pluralities of electrical device product types, makes and models. An individual device nest 10 may thereby have an increased economic value over the prior art by a ubiquitous utility in testing pluralities of device types with a same device nest 10.

Figure 9:
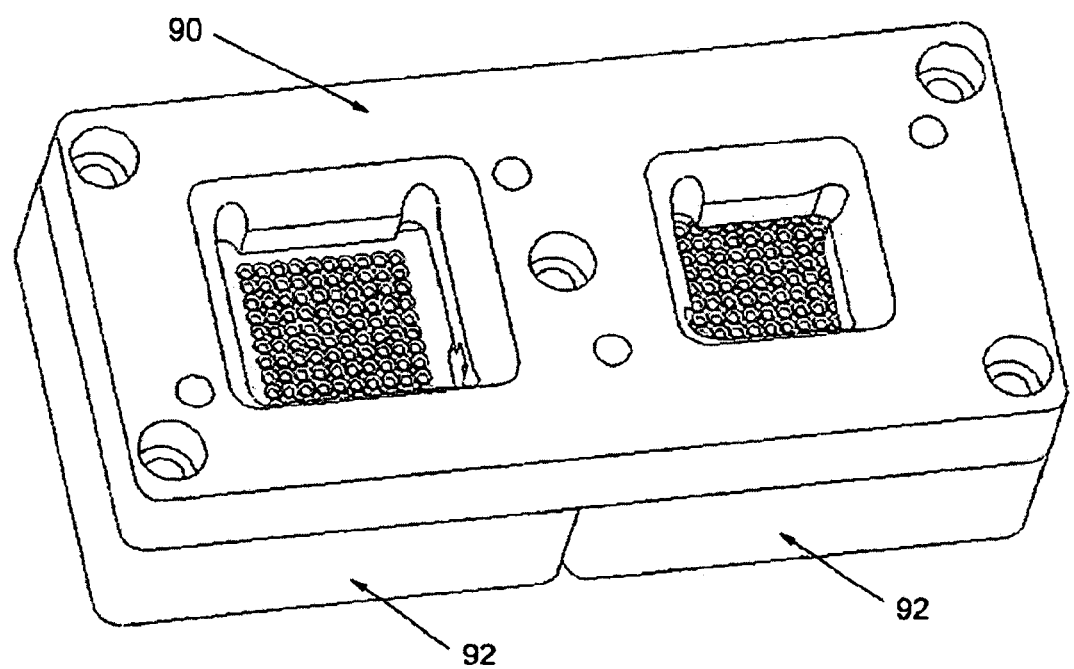
FIG. 9 is a cutaway perspective view of another device nest that is useful in guiding two devices identical to the device under test of FIG. 5A into substantially simultaneous electrical connection with the automated test system of FIG. 1.

Referring now generally to the Figures and particularly to FIG. 9, FIG. 9 is a cutaway perspective view of a multiple device nest 90 that is useful in guiding two devices 62 into substantially simultaneous electrical connection with the automated test head 4 of FIG. 1. A cutaway perspective view of the multiple device nest 90 that is useful in guiding two devices identical to the device 62 of FIG. 5A into substantially simultaneous electrical connection with the automated test head 4 of FIG. 1. The multiple device nest 90 is detachably attached to one, two or more vertical signal frames 70, 80 or 92 and is used to enable the simultaneous or non-simultaneous placement of separate devices 62 into each of a plurality of device nest apertures 86 and frames 70, 80 or 92, whereby a plurality of devices 62 may be tested by the automated head 4 of FIG. 1.

Figure 9A:
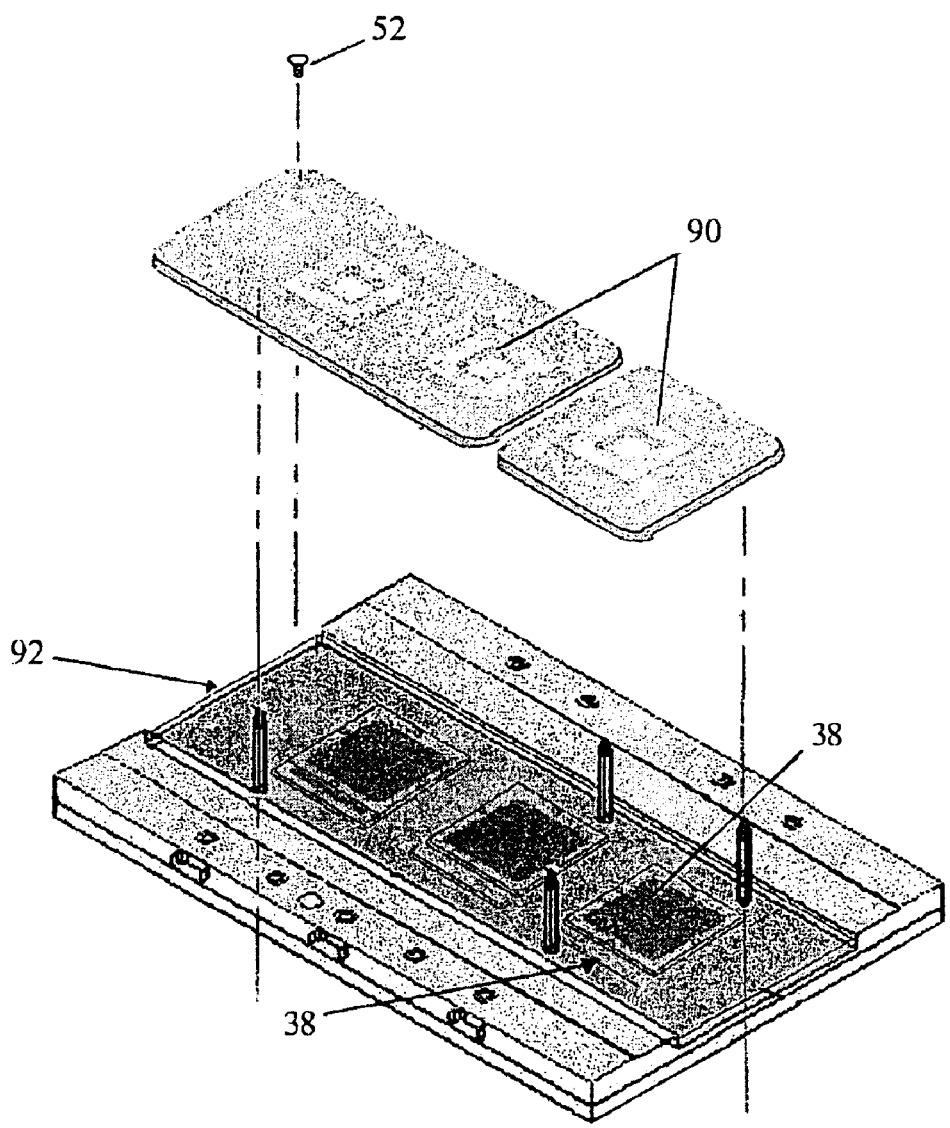
FIG. 9A illustrates a combination of the multiple device nest of FIG. 9 with the vertical signal frame of FIG. 9.

Referring now generally to the Figures and particularly to FIG. 9A, FIG. 9A illustrates a combination of the multiple device nest 90 of FIG. 9 with the vertical signal frame 92 and a plurality of device contacts 38.

Those skilled in the art will appreciate that various adaptations and modifications of the just-described preferred embodiments can be configured without departing from the scope and spirit of the invention. Other suitable electrical interfacing techniques and methods known in the art can be applied in numerous specific modalities by one skilled in the art and in light of the description of the present invention described herein. Therefore, it is to be understood that the invention may be practiced other than as specifically described herein. The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

I claim:

1. An electrical interconnect for providing electrical signal pathways from a device under test to an electrical test system, the device under test having a plurality of device electrical contacts arranged in a planar device pattern, the electrical test system having a plurality of pin electronics contacts arranged in a planar test system contact pattern, the electrical interconnect comprising:

a signal distribution board, the signal distribution board having a plurality of signal distribution traces, a tester side and an upper side, the tester side and the upper side being substantially planar and parallel;

the plurality of signal distribution traces each having a tester side contact, a signal distribution pathway and an upper side contact, each of the plurality of signal distribution traces providing a substantially electrically isolated signal pathway between an individual tester side contact and an individual upper side contact;

the plurality of tester side contacts arranged on the tester side of the signal distribution board in a pattern substantially matching the test system contact pattern, and each tester side contact in electrical connection with an individual pin electronics contact of the electrical test system;

the plurality of upper side contacts arranged in a upper side pattern, the upper side pattern including a personality pattern, the personality pattern substantially matching the device pattern;

the plurality of signal distribution traces providing a plurality of individual and substantially electrically isolated electrical pathways from the plurality of pin electronics contacts of the electrical test system to the plurality of upper side contacts;

a vertical signal frame, the vertical signal frame attached to the upper side of the electrical signal distribution board, the vertical signal frame have a body housing a plurality of electrically conductive elongate vertical pins, the body maintaining each of the elongate vertical pins in a substantially fixed position and maintaining the plurality of elongate vertical pins in a pattern substantially matching the upper side pattern;

each elongate vertical pin having a board contact, an elongate body and a device contact, each elongate vertical pin positioned substantially normal to the upper side of the signal distribution board, each board contact of each elongate vertical pin in electrical connection with an individual upper side contact of the signal distribution board, and each elongate vertical pin providing a substantially isolated electrical signal pathway between an individual upper side contact of the signal distribution board and the device contact of the elongate vertical pin via the elongate body of the elongate vertical pin; and a device nest having a nest frame and at least two apertures, the nest frame detachably secured to the vertical signal frame and designed to selectively guide the device under test to seat within one of the apertures and above the personality pattern, and to position each of the plurality of device electrical contacts of the device under test in electrical connection with an individual device contact of an elongate vertical pin and the electrical test system, whereby the device nest is substantially constrained from movement in relation to the vertical signal frame when secured to the signal frame.

2. An electrical interconnect for providing electrical signal pathways from at least two substantially similar devices under test to an electrical test system, each device under test having a plurality of device electrical contacts arranged in a planar device pattern, the electrical test system having a plurality of pin electronics contacts arranged in a planar test system contact pattern, the electrical interconnect comprising:

a signal distribution board, the signal distribution board having a plurality of signal distribution traces, a tester side and an upper side, the tester side and the upper side being substantially planar and parallel;

the plurality of signal distribution traces each having a tester side contact, a signal distribution pathway and an upper side contact, each of the plurality of signal distribution traces providing a substantially electrically isolated signal distribution pathway between an individual tester side contact and an individual upper side contact;

the plurality of tester side contacts arranged on the tester side of the signal distribution board in a pattern substantially matching the test system contact pattern, and each tester side contact in electrical connection with an individual pin electronics contact of the electrical test system;

the plurality of upper side contacts arranged in a upper side pattern, the upper side pattern including at least two personality pattern patterns, each personality pattern substantially matching the planar device pattern;

the plurality of signal distribution traces providing a plurality of individual and substantially electrically isolated electrical pathways from the plurality of pin electronics contacts of the electrical test system to the plurality of upper side contacts;

a vertical signal frame, the vertical signal frame attached to the upper side of the electrical signal distribution board, the vertical signal frame have a body a plurality of electrically conductive elongate vertical pins, the body maintaining each of the elongate vertical pins in a substantially fixed position and maintaining the plurality of elongate vertical pins in a pattern substantially matching the upper side pattern;

each elongate vertical pin having a board contact, an elongate body and a device contact, each elongate vertical pin positioned substantially normal to the upper side of the signal distribution board, each board contact of each elongate vertical pin in electrical connection with an individual upper side contact of the signal distribution board, and each elongate vertical pin providing a substantially isolated electrical signal pathway between an individual upper side contact of the signal distribution board and the device contact of the elongate vertical pin via the elongate body of the elongate vertical pin; and a device nest having a nest frame and at least two apertures, the nest frame detachably secured to the vertical signal frame and designed to selectively guide the device under test to seat within one aperture and above the personality pattern, and to position each of the plurality of device electrical contacts of the device under test in electrical connection with an individual device contact of an elongate vertical pin and the electrical test system, whereby the device nest is substantially constrained from movement in relation to the vertical signal frame when secured to the signal frame.

3. A method of testing semiconductor devices by means of an electrical test system and a contactor board, the contactor board attachable to the electrical test system and the contactor board providing a plurality of individual electrical signal pathways between individual pin electronics of the test system and a plurality of contacts, the plurality of contactor board contacts arranged in a substantially flat plane, the method comprising:

a. providing a first nest, the first nest comprising at least one electrically conductive pin, and the first nest being substantially rigid and maintaining the at least one electrically conductive pin in position useful for electrically connecting a contact pad of a first semiconductor device and at least one contactor board contact when the first nest is attached to the contactor board;

b. detachably attaching the first nest to the contactor board;

c. testing a plurality of first semiconductor devices by means of the first nest, the contactor board and the electrical test system;

d. detaching the first nest from the contactor board;

e. providing a second nest, the second nest comprising at least one alternate electrically conductive pin, and the second nest being substantially rigid and maintaining the at least one alternate electrically conductive pin in position useful for electrically connecting an alternate contact pad of a second semiconductor device and at least one contactor board contact when the second nest is attached to the contactor board;

f. detachably attaching the first nest to the contactor board; and g. testing a plurality of first semiconductor devices by means of the second nest, the contactor board and the electrical test system, whereby the contactor board remains attached to the test system in steps a through g.

4. The method of claim 3, wherein the second nest is configurable to make electrical connection with at least two different body shapes, and further comprising:

h. configuring the second nest for making electrical connection with a selected body shape of one of the at least two body shapes of the second semiconductor device; and i. testing a plurality of second semiconductor devices having the selected body shape of one of the at least two body shapes of the second semiconductor device by means of the second nest, the contactor board and the electrical test system.

* * * * *